United States Patent [19]

Greschner et al.

[11] Patent Number: 4,642,163

[45] Date of Patent: Feb. 10, 1987

[54] METHOD OF MAKING ADHESIVE METAL LAYERS ON SUBSTRATES OF SYNTHETIC MATERIAL AND DEVICE PRODUCED THEREBY

[75] Inventors: Johann Greschner, Pliezhausen; Friedrich W. Schwerdt, Herrenberg; Hans J. Trumpp, Stuttgart, all of Fed. Rep. of Germany

[73] Assignee: International Business Machines Corporation, Armonk, N.Y.

[21] Appl. No.: 547,553

[22] Filed: Oct. 31, 1983

[30] Foreign Application Priority Data

Feb. 23, 1983 [EP] European Pat. Off. ........ 83101752.0

[51] Int. Cl.[4] ........................... B44C 1/22; B05D 3/00
[52] U.S. Cl. ..................................... 156/643; 156/644; 156/651; 156/659.1; 156/663; 156/668; 427/307; 204/192.3
[58] Field of Search .............. 156/638, 633, 643, 644, 156/646, 650, 651, 652, 654, 655, 663, 668, 659.1, 902; 427/250, 307, 40, 98, 306, 304; 204/192 E, 192 EC, 30, 32.1, 34.5, 192 R

[56] References Cited

U.S. PATENT DOCUMENTS

| | | | |
|---|---|---|---|
| 3,424,658 | 1/1969 | Norton | 156/665 X |
| 3,846,168 | 11/1974 | Elmore | 252/79.5 X |
| 3,985,597 | 10/1976 | Zielinski | 156/655 X |
| 4,208,241 | 6/1980 | Harshbarger et al. | 156/643 |
| 4,256,534 | 3/1981 | Levinstein et al. | 156/643 |
| 4,307,179 | 12/1981 | Chang et al. | 156/646 X |
| 4,349,609 | 9/1982 | Takeda et al. | 428/447 X |
| 4,364,792 | 12/1982 | Gliem et al. | 156/628 |
| 4,420,365 | 12/1983 | Lehrer | 156/643 |

FOREIGN PATENT DOCUMENTS

| | | |
|---|---|---|
| 2425223 | 1/1975 | Fed. Rep. of Germany . |
| 2445803 | 4/1976 | Fed. Rep. of Germany . |
| 2713391 | 3/1980 | Fed. Rep. of Germany . |
| 2916006 | 1/1983 | Fed. Rep. of Germany . |
| 53-88876 | 8/1978 | Japan ................................... 427/307 |
| 55-106234 | 8/1980 | Japan ................................... 427/307 |
| 1588998 | 5/1981 | United Kingdom . |

OTHER PUBLICATIONS

Pao, S. P. et al., "A Study of the Etching Effect on the Metal-to-ABS Surface Adhesion in Electroless Plating", Metal Finishing, Aug. 1977, pp. 13–16.

V. Y. Doo, "Method of Making High Density Ink Jet Nozzles," IBM TDB, vol. 23, No. 7a, Dec. 1980, pp. 2759–2760.

Levy et al., "Interfacial Bonding of Nickel to Polyamide-Imide", *Plating and Surfacing Finishing*, Jun. 1979, pp. 68–71.

Mueller et al., "Simplified Production of Printed Circuit Boards by the Additive Process", *IBM Tech. Discl. Bull.*, vol. 25, No. 5, 10/82, p. 2339.

*Primary Examiner*—Ramon R. Hoch
*Attorney, Agent, or Firm*—Barbara A. McDowell; M. F. Chadurjian; M. H. Klitzman

[57] ABSTRACT

A method of improving the adhesion between a synthetic substrate and metallized layers deposited thereon. A glass resin layer is spin-coated onto an epoxide substrate. The glass layer is covered by a photoresist layer which is roughened by reactive ion etching. The roughened contour of the photoresist layer is transferred via reactive ion etching to form a perforation pattern in the glass layer. The substrate is then etched vertically and horizontally to produce recesses in the substrate having overhanging walls. A thin copper layer is sputtered onto the substrate and copper conductors are sputtered onto the thin copper layer, the copper layers filling the recesses. The recesses and overhangs form mortices in the substrate, and the copper layers within the recess form tenons which fittingly engage with the mortices to produce adhesion between the substrate and the metallized layers in the order of 1000 n/m.

8 Claims, 6 Drawing Figures

REACTIVE ION ETCHING OF RECESSES (4) IN AN OXYGEN PLASMA AT LOW PRESSURE

REACTIVE ION ETCHING OF AN OVERHANG STRUCTURE (5) IN AN OXYGEN PLASMA AT HIGHER PRESSURE

HIGH RATE CATHODE SPUTTERING OF COPPER LAYER (6)

ELECTROLESS DEPOSITION OF COPPER (7)

METHOD OF MAKING ADHESIVE METAL LAYERS ON SUBSTRATES OF SYNTHETIC MATERIAL AND DEVICE PRODUCED THEREBY

TECHNICAL FIELD

The invention relates generally to a method of forming adhesive metal layers upon substrates of synthetic material by structuring the substrate surfaces to be coated prior to metallization, and more specifically to a method of forming metallic conductors on epoxide resin substrates.

BACKGROUND ART

Circuit cards with conductors printed thereon have been manufactured by use of a subtractive method. In the subtractive method, copper foil is laminated onto a suitable substrate made of a synthetic material, and a photoresist is applied onto the copper foil. The photoresist is exposed and developed to produce the desired pattern of conductors by etching excess copper from the surface of the circuit card. As a result of this method, copper conductors can be made having widths larger than the thickness of the copper material laminated onto the circuit card. However, in view of the increasing pattern densities of circuit cards and the decreasing widths of the conductors currently used in the art, the subtractive method can no longer be utilized (owing to the lateral underetching of the photoresist masks).

With the ever increasing demand for the production of thin conductors, a number of additive metal deposition methods have been developed. In such an additive method, a thin copper foil is laminated onto the surfaces of of synthetic substrates. Instead of the unwanted copper being etched off, conductors are grown on the regions of the copper laminate which are not covered by a photoresist mask layer. Subsequently, the surplus copper of the laminated foil is etched off. The main problem inherent in such additive methods is providing a solid and reliable adhesion between the conductors applied by electroless deposition and the substrate of the circuit card.

Several adhesion-promoting methods known in the art will now be discussed in more detail.

One of the methods known in the art for increasing the adhesion between the conductive metal layers (which are applied by electroless deposition) and the substrate involves roughening the surface of the substrate to be coated by use of an abrasion process. Specifically, this method involves the steps of impressing a relief on a roughened surface; swelling and roughening the surface by means of acids, bases or solvents; using adhesion-promoting intermediate layers and embedding in the adhesion promoter foreign substances removable by means of acids or bases; or vapor depositing adhesion-promoting intermediate layers. It is also known (e.g. from German Offenlegungsschrift No. 24 45 803) to prepare the entire surface of a carrier plate by intensive, even repeated wet sand blasting.

German Offenlegungsschrift No. 24 25 223 discloses another method for improving the adhesion of metallic layers on the surface of a synthetic substrate. A solution of zinc oxide, copper (II) oxide, and sodium hydroxide is deposited on an aluminum foil to form a micro-nodular surface. The aluminum foil is then applied to the surface of the synthetic substrate. The aluminum foil and the zinc are removed in an etch bath, and copper conductors are applied by electroless plating onto the roughened surface of the synthetic substrate.

German Auslegeschrift No. 27 13 391 teaches a method for making a carrier material for printed circuits. In this method, the carrier material is coated with a thin copper layer and is transported through one or several roller pairs. A slurry is applied to the rollers or to the surface of the copper layer. The slurry contains quartz powder, glass powder or similar material. The rollers cause the surface of the copper layer to become micro-roughened by pressing the quartz or dust particles into the copper layer. A covering layer is then applied to the micro-roughened surface of the copper layer, and conductors are provided by metal deposition onto those areas of the copper layer not coated by the covering layer.

In more recent methods for making printed circuits, the copper is applied by vapor deposition in a vacuum or by sputtering onto laminates of synthetic material. These methods have not been used widely because the resulting thin copper layer has a relatively poor adhesion to the synthetic material laminate. Previously known roughening methods, such as those discussed above (as well as the roughening of epoxide resin surfaces in an oxygen plasma or the sand blasting process described in IBM Technical Disclosure Bulletin Vol. 25, No. 5, October 1982, p. 2339 by H. Meuller, J. Schneider, and F. Schwerdt), do not produce sufficient results because during the roughening process the thickness of the entire epoxide resin layer is reduced to a point where the embedded glass fiber fabric is adversely affected.

Finally, German Offenlegungsschrift No. 29 16 006 describes a method of making adhesive metallic layers on non-conductive surfaces, in particular on surfaces of synthetic material, wherein the surface regions to be coated are roughened by means of etching and are exposed prior to the etching process to a source of high energy radiation.

Thus, a need has arisen in the art for forming metallic layers on a non-conductive surface such as a synthetic material in which the metallic layers have a high adhesion characteristic (in the order of 1000 n/m) with respect to the non-conductive surface. As discussed above, the methods currently used in the art for increasing adhesion between a metallic layer and a synthetic substrate are unatisfactory where the metallic layer is either sputtered or deposited onto the substrate. Further, such adhesions have proved to be insufficient where the composite structure is to undergo further metallization steps in which thermal strains are applied. Moreover, the above-discussed bonding materials and adhesion promoters are expensive, and their uniform application involves considerable effort.

SUMMARY OF THE INVENTION

It is an object of this invention to provide an improved method for forming metallic layers with high adhesion characteristics on a non-conductive surface.

Another object of this invention is to provide an improved device having metallic layers with high adhesion chracteristics on an non-conductive surface.

It is an object of the invention to provide a method for generating discrete recesses on the surfaces of substrates made of synthetic material, said recesses forming a foundation for subsequent metallization processes.

The foregoing and other objects are realized by the manufacturing method of the present invention, wherein recesses with overhangs are produced in the surface of a synthetic substrate prior to metallization. A glass resin layer, preferably 0.2 m in thickness, is spin-coated and cured on the surface of a synthetic substrate to be metallized. A photo- or electron beam resist is applied in a layer thickness between 1.0 to 4.0 μm onto the glass resin layer. The assembly is then heated to a temperature of 80° to 90° C. in order to remove at least a portion of the solvent from the resist. The resist layer is then roughened by reactive ion etching in a $CF_4$ plasma. Secondary electron microscope (SEM) recordings of the thus roughened photoresist show that the roughness structures and between 0.1 and 3 μm in depth. In the next step, and also by reactive ion etching in a $CF_4$ plasma, this roughness contour is transferred to the glass resin layer in such a manner that a perforation pattern corresponding to the photoresist roughness contour is formed therein. The thus obtained glass resin matrix is used as a mask for a subsequent reactive oxygen etching process which is executed in the same reactor. First, recesses of approximately 2 μm in depth are etched with an oxygen plasma through the glass resin matrix into the synthetic substrate. After the pressure of the oxygen plasma has been fixed, these recesses are recessed still further, creating an overhang structure within the substrate. The glass resin layer is then removed and a thin copper layer of approximately 0.2 to 0.5 μm in thickness is applied by sputtering. Following the application of a photoresist mask layer, a conductive pattern is deposited on the thin copper layer through electroless deposition by means of an additive process. The thickness of the copper layer applied by electroless deposition is approximately 35 μm. The surplus copper applied by sputtering is etched off after the removal of the photoresist mask. In the same manner, a copper layer can be applied instead of conductive patterns.

By use of the manufacturing method of the present invention, discrete recesses with overhangs are produced in a synthetic substrate, forming discrete mortises therein. When subsequent metallized layers are deposited onto the synthetic substrate, the metal fills the mortises to form discrete metallic tenons. The fitting engagement between the discrete mortises in the synthetic substrate and the discrete metallic tenons projecting from the metallized layers greatly enhances the adhesion between the substrate and the metallized layers. More specifically, adhesions in the order of 1000 n/m can be reached by use of the manufacturing method of the invention.

BRIEF DESCRIPTION OF THE DRAWING

The invention will now be described in detail with reference to a preferred embodiment thereof. In the description to follow, reference will be made to FIGS. 1A through 1F, which illustrate schematic cross sections of the structure undergoing the successive process steps of the invention, together with an explanatory flow diagram describing the various process steps.

BEST MODE FOR CARRYING OUT THE INVENTION

FIGS. 1A to 1E show the transfer of the photoresist material roughness into a subtrate of epoxide resin by means of reactive ion etching, using an etching barrier of spun-on glass resin. This structured substrate surface ensures a particularly high adhesion of metal on substrate.

Figure 1A:
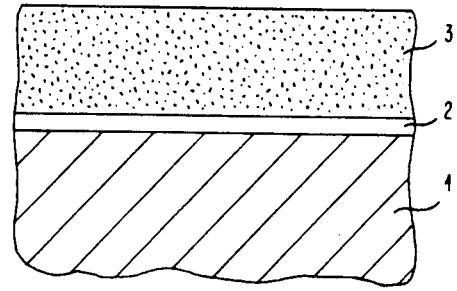

In FIG. 1A, a substrate material is used which is made up of a glass fabric which is drawn through an epoxide resin solution. The resin-impregnated glass fabric is subsequently cured to a predetermined degree under the influence of heat (i.e., the epoxide resin portion of the glass fabric is partially polymerized up to a predetermined state of partial curing). The partialy cured substrate material (hereinafter referred to as a "prepreg" in the B-state) is cut into plates of a predetermined size. The plates are fitted with separating foils and are assembled into stacks. The stacked plates are then fully cured in a laminating press at temperatures of 130° to 180° C. and pressures of 500 to 2000 $N/cm^2$. Additional and specific details concerning the substrate material processing, and the composition of a typical epoxide resin, are disclosed in U.S. Pat. No. 3,523,037.

A glass resin layer 2 is deposited on the epoxide material 1 by spin-on or immersion. In the preferred embodiment, the resin is spin-coated onto a spinning substrate 1. The rotation speed of substrate 1 is approximately 4200 rpm. Layer 2 preferably consists of a 0.2 μm thick layer of polydimethylsiloxane resin (which is produced by Owens, Ill. under the designation 650), and dissolved in N-butylacetate, with 1 g resin to 10 ml solvent. The polydimethylsiloxane resin 2 is cured in nitrogen at a temperature of approximately 120° to 140° C. for 10 to 15 minutes. A layer 3 consisting of a photoresist or an electron beam resist is spin-coated on top of resin 2. Layer 2 can be prepared to receive the photoresist or electron beam resist material by means of hexamethyl disilazane, or the A-1100 silane marketed by Union Carbide Corporation. Layer 3 can be composed of any kind of resist materials which are used for coating and which adhere well to glass resin layers. Furthermore, the resist materials must be thermally stable and removable via reactive ion etching. The preferred photoresist material consists of a phenol-formaldehyde resin and 3,4-dihydroxybenzophenone-4-naphthoquinone (1, 2) diazide(2) sulfonate as a reactive component. This photoresist can be obtained from Shipley under the designation AZ 1350J. The photoresist is spin coated in a layer thickness of approximately 1.0 to 4.0 μm, and exposed for approximately 20 to 30 minutes to a temperature of approximately 80° to 90° C. During this period, part of the solvent is driven out of the resist.

Figure 1B:
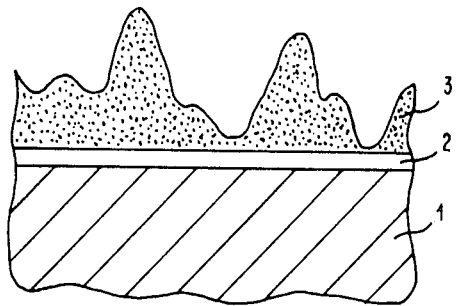

Subsequently, as shown in FIG. 1B, photoresist layer 3 is roughened by reactive ion etching. The structure of FIG. 1A is placed into a chamber for an RF sputter etching, as described, for example, in U.S. Pat. No. 3,598,710. Photoresist layer 3 is roughened by reactive ion etching, with the following parameters:

| | |
|---|---|
| gas: | $CF_4$ |
| flow rate: | 30 $cm^3$/min. |
| pressure: | 40 μbar |
| energy density: | 0.5 watt/$cm^2$ |
| etch period: | 5 to 10 minutes |

The relatively high energy density of 0.5 watt/$cm^2$ causes a roughening or deformation of the photoresist.

Figure 1C:
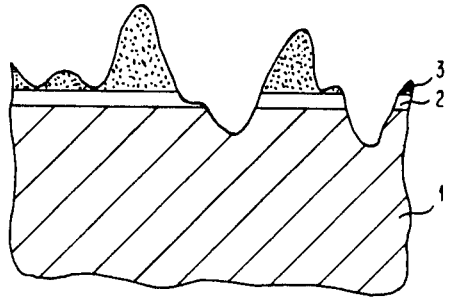
Figure 1D:
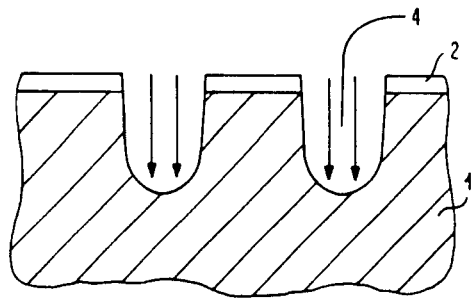

Subsequently, as shown in FIG. 1C, the roughness profile produced in photoresist layer 3 is transferred as a perforation pattern into glass resin layer 2. The roughness transfer is effected by reactive ion etching with the following parameters:

| | |
|---|---|
| gas: | CF$_4$ |
| flow rate: | 30 cm$^3$/min. |
| pressure: | 40 μbar |
| energy density: | 0.2 watt/cm$^2$ |
| etch period: | 15 minutes |

With the glass resin layer 2 now having a perforation structure as shown in FIG. 1C, recesses 4 (see FIG. 1D) are made in the surface of the epoxide resin substrate 1. Recesses 4 are formed by means of reactive ion etching the substrate through the perforation structure in an oxygen atmosphere. The vertical reactive ion etching is performed with the following parameters:

| | |
|---|---|
| gas: | O$_2$ |
| flow rate: | 100 cm$^3$/min. |
| pressure: | 6.0 μbar |
| energy density: | 0.2 watt/cm$^2$ |
| etch period: | 10 to 15 minutes |
| etch depth: | 2 μm |

Vertical etching is ensured owing to the low pressure of the oxygen plasma between 4 and 6 μbar.

Figure 1E:
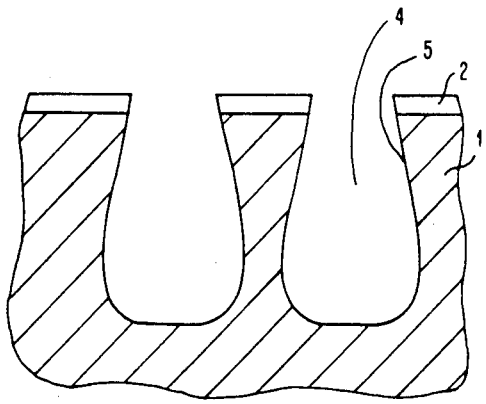

By further reactive ion etching in an oxygen atmosphere, as shown in FIG. 1E, the recesses of epoxide resin substrate 1 can be increased in depth, and an overhang structure 5 can be produced to form mortises in the substrate 1. Reactive ion etching is performed by means of the following parameters:

| | |
|---|---|
| gas: | O$_2$ |
| flow rate: | 100 cm$^3$/min. |
| pressure: | approximately 250 μbar |
| energy density: | 0.2 watt/cm$^2$ |
| etch period: | 6 minutes |
| etch depth: | approximately 4 μm. |

The pressure of the oxygen plasma defines the size of the overhang. As shown by secondary electron microscope (SEM) recordings, a clearly detectable overhang can be achieved with an oxygen pressure of approximately 250 μbar. In the case where glass resin layer 2 is allowed to remain on substrate 1, it is irremovably bound thereto after copper plating of the surface of substrate 1. However, the glass resin layer 2 can be removed, e.g. by means of a dry etching process, at this point in the process.

Figure 1F:
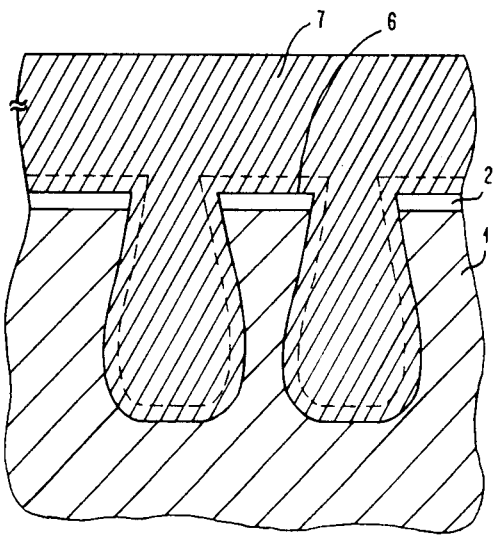

As shown in FIG. 1F, a copper layer 6 is sputtered onto the epoxide resin substrate 1 structured in accordance with the invention. The copper is sputtered onto substrate 1 by means of magnetic field-supported high rate cathode sputtering. This kind of high rate cathode sputtering (i.e., in which the plasma is concentrated directly in front of the cathode and the substrates are totally exposed to the flow of the sputtered material only partially exposed to the bombardment of secondary electrons), is described in IBM Technical Disclosure Bulletin Vol. 20, No. 4, September 1977, pp. 1550 to 1551 by D. R. Hunter et al. Typical high sputtering rates for copper are approximately in the 2.5 μm/min. range. Copper layer 6 is 0.2 to 0.5 μm/min. range. Copper layer 6 is 0.2 to 0.5 μm in thickness. Note that a copper layer 6 with a layer thickness of less than 0.2 μm does not, in and of itself, lead to a high adhesion of the copper on the substrate surface. However, the adhesion values for the sputtered-on copper layer which are measured at stripes of 25 mm width, and extrapolated to one meter, are within a range of approximately 1000 n/m.

Subsequently, after the application of a photoresist mask layer (not shown), patterned copper conductors are deposited by electroless deposition and by means of an additive process onto the sputtered-on copper layer 6. While sputtered copper layer 6 is approximately 0.2 to 0.5 μm thick, the electroless-deposited copper 7 has a layer thickness of approximately 35 μm. For depositing the copper, a long term bath produced by Photocircuits - Kollmorgen with the following operating data can be used:

| | |
|---|---|
| pH value: | 12.6 standardized with NaOH |
| CuSO$_4$.5 H$_2$O: | 10.5 g/l high purity copper salt |
| HCHO (37%): | 3.5 ml/l as a reduction agent |
| NaCN: | 26 mg/l as a ductility promoter |
| AeDTA: | 17.5 g/l as a complexing agent |
| temperature: | 53 ± 1° C. |

The deposition rate for this process step is approximately 2.5 μm per hour. Subsequently, the photoresist mask layer is removed in a known manner, and the thin sputtered-on copper layer 6 is etched off in a flash etching process without the conductors being substantially affected.

By means of the above-described surface structure of the substrate, the adhesive properties of the metallized layers can be considerably improved. The size of the recesses and the form of the overhangs (i.e., the shape of the mortises) can be determined by the specially spin-coated layers of glass resin and photoresist material, by the selection of the plasma and pressure, and by the duration of the etch period. Apart from epoxide resins, it is also possible to similarly pre-process and subsequently metallize other synthetic materials, e.g. polyimides. Copper can be sputtered onto the synthetic material laminates structured in accordance with the invention, as described above. However, coating can also be effected by vapor deposition in a vacuum, or (after an activation of the substrate surface with tin (II) chloride hydrochloric acid and palladium chloride, or with a palladium activator containing organic protective colloids) by reductive deposition from a bath onto the structured active surface.

The method as disclosed by the invention is advantageously used for the copper plating of epoxide resin foils and boards. In this manner, high quality printed circuits with hitherto unequalled adhesion properties can be made at reasonable costs.

It is to be understood that modifications can be made to the teachings of the present invention without departing from the spirit and scope of the appended claims.

What is claimed is:

1. A method for improving the metal adhesion characteristic of the surface of a non-conductor substrate, said method comprising the steps of:
    applying a glass resin onto said surface of said substrate;
    applying a photoresist on top of said glass resin layer;
    roughening said photoresist to create a roughened contour thereon;
    transferring said roughened contour from said photoresist to said glass resin by etching in a first gas atmosphere to form a perforation structure;

creating shallow recesses in said substrate by etching in a second gas atmosphere, wherein said recesses are made by substantially anisotropic etching followed by substantially isotropic etching, said recesses having a first width at said surface of said substrate and a second width greater than said first width in a region of said substrate below said surface.

2. The method as recited in claim 1 wherein said steps of roughening of said second layer and transferring said roughened contour to said first layer are both completed by reactive ion etching in said first gas atmosphere.

3. A method of forming adhesive metal layers on substrates, comprising the steps of:
   (a) applying a first layer of glass resin onto a surface of said substrate to be metallized;
   (b) applying a second layer of a photoresist onto said first layer;
   (c) roughening said second layer by reactive ion etching in a first gas atmosphere;
   (d) transferring the roughness of said second layer to form a perforation structure in said first layer by reactive ion etching in said first gas atmosphere;
   (e) making shallow recesses in said surface of said substrate to be metallized by substantially vertical reactive ion etching in a second gas atmosphere, using said perforation structure as a mask;
   (f) horizontally etching said recesses to form overhang structures in said surface of said substrate by reactive ion etching in said second gas atmosphere;
   (g) sputtering a first thin metal layer onto said surface of said substrate prepared in accordance with steps (a) through (f) above; and
   (h) applying a second metal layer onto said first thin metal layer by means of electroless metal deposition.

4. The method as recited in claim 3, wherein said substrate comprises a glass fiber reinforced epoxide resin.

5. The method as recited in claim 3, wherein said recesses are made by vertical etching in said second gas atmosphere at a first pressure and said overhang structures are made by horizontal etching in said second gas atmosphere at a second pressure greater than said first pressure.

6. A method of forming adhesive metal layers on substrates, comprising the steps of:
   (a) manufacturing a substrate;
   (b) spin-coating a glass resin layer onto said substrate;
   (c) spin-coating a photoresist layer onto said glass resin layer;
   (d) roughening said photoresist layer by reactive ion etching at a first energy density, producing a roughness profile thereon;
   (e) transferring said roughness profile of said photoresist layer as a perforation pattern into said glass resin layer by reactive ion etching at a second energy density less than said first energy density;
   (f) forming recesses in said substrate through said perforation structure by substantially vertical reactive ion etching at a first plasma pressure;
   (g) forming overhangs in said substrate through said perforation structure by horizontal reactive ion etching at a second plasma pressure greater than said first plasma pressure;
   (h) removing said glass resin layer;
   (i) depositing a first copper layer onto said substrate by magnetic field-supported high rate cathode sputtering;
   (j) depositing a plurality of patterned copper conductors onto said first copper layer by electroless deposition in a bath; and
   (k) removing said first copper layer.

7. The method according to claim 1 wherein said non-conductor substrate is a layer of resin-impregnated glass fabric in a printed circuit board.

8. The method according to claim 3 wherein said substrate is a layer of resin-impregnated glass fabric in a printed circuit board.

* * * * *